(12) United States Patent
Kimura et al.

(10) Patent No.: US 6,728,175 B2
(45) Date of Patent: Apr. 27, 2004

(54) INFORMATION RECORDING METHOD AND APPARATUS

(75) Inventors: Tetsu Kimura, Kanagawa (JP); Akio Ishikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 83 days.

(21) Appl. No.: 10/005,419

(22) Filed: Dec. 3, 2001

(65) Prior Publication Data

US 2002/0057636 A1 May 16, 2002

Related U.S. Application Data

(62) Division of application No. 09/247,715, filed on Feb. 9, 1999, now Pat. No. 6,356,521.

(30) Foreign Application Priority Data

Feb. 10, 1998 (JP) .......................................... 10-028678

(51) Int. Cl.$^7$ ................................................ G11B 5/09
(52) U.S. Cl. ............................... 369/47.14; 369/53.17; 369/30.07
(58) Field of Search ..................... 369/47.14, 53.36, 369/59.25, 53.17, 53.24, 59.14, 53.16, 30.04, 275.1, 275.2, 47.49, 30.07; 386/95, 125, 96

(56) References Cited

U.S. PATENT DOCUMENTS

| | | | | |
|---|---|---|---|---|
| 4,885,735 A | | 12/1989 | Fukushima | 369/275.1 |
| 5,237,553 A | * | 8/1993 | Fukushima et al. | 369/53.17 |
| 5,265,230 A | | 11/1993 | Saldanha et al. | 369/275.2 |
| 5,442,614 A | | 8/1995 | Tamegai | 369/53.17 |
| 5,526,335 A | | 6/1996 | Tamegai | 369/53.16 |
| 5,537,636 A | | 7/1996 | Uchida et al. | 369/59.14 |
| 5,623,470 A | * | 4/1997 | Asthana et al. | 369/47.49 |
| 5,646,923 A | | 7/1997 | Shea | 369/53.17 |
| 5,966,358 A | | 10/1999 | Mine | 369/47.14 |
| 6,205,099 B1 | * | 3/2001 | Sasaki et al. | 369/53.17 |
| 6,292,625 B1 | * | 9/2001 | Gotoh et al. | 386/95 |

FOREIGN PATENT DOCUMENTS

| | | |
|---|---|---|
| EP | 0 383 298 | 8/1990 |
| EP | 0 545 711 | 6/1993 |
| EP | 0 697 699 | 2/1996 |

OTHER PUBLICATIONS

Patent Abstracts of Japan vol. 14, No. 465, (P–1114), Oct. 9, 1990 & JP 02 185766 A (Cannon Inc), Jul. 20, 1990.

* cited by examiner

*Primary Examiner*—William Korzuch
*Assistant Examiner*—Kim-Kwok Chu
(74) *Attorney, Agent, or Firm*—Frommer Lawrence & Haug LLP; William S. Frommer; Bruno Polito

(57) ABSTRACT

An information recording apparatus for recording data into a recording medium taking as recording unit a sector corresponding to a predetermined amount of information signal, comprises a file management unit (5) to classify an information signal for recording into the recording medium (101) into a number, two or more, of groups depending upon the importance of the information signal, and a write/read unit (6) to record the information signal into the recording medium (101) while dealing with a defective sector, if any, in the recording medium (101) in a manner designated for the group to which the information signal has been classified to belong at the above classifying step, and record a highly important information signal, when a defective sector is found by checking up the information signal recorded in the recording medium (101), into another sector.

8 Claims, 15 Drawing Sheets

| MIB NO. | LOGICAL SECTOR |
|---|---|
| 0 | X |
| 1 | MIA MAP (0) |
| 2 | X |
| 3 | FILE TABLE (0) |
| 4 | AE TABLE (0) |
| 5 | AE TABLE (1) |
| 6 | FILE TABLE (1) |
| 7 | MIA MAP (1) |
| 8 | X |
| 9 | FILE TABLE (2) |
| A | AE TABLE (2) |
| B | |
| C | |

| ··· | 11 | 12 | 13 | 14 | 15 | ··· | 100 | 101 | ··· |

| LOGICAL ADDRESS | 11 | 12 | 13 | 14. | 15 | ··· |
|---|---|---|---|---|---|---|
| PHYSICAL ADDRESS | 11 | 13 | 14 | 15 | 16 | ··· |

| LOGICAL ADDRESS | 11 | 12 | 13 | 14 | 15 | ··· |
|---|---|---|---|---|---|---|
| PHYSICAL ADDRESS | 11 | 100 | 13 | 14 | 15 | ··· |

| | |
|---|---|
| MAIN MIA | START LOGICAL SECTOR NO. OF MIA |
| | MIB NO. OF MIA MAP (0) |
| | MIB NO. OF MIA MAP (1) |
| | ⋮ |
| AUXILIARY MIA | ⋮ |

FIG.16

MIA MAP: 1, FILE TABLE: 3, AE TABLE: 4 ···

| FFF0 | 7 | FFF0 | 6 |
|---|---|---|---|
| 5 | A | 9 | FFFF |
| FFF0 | FFFF | FFFF | FFF1 |
| FFF1 | FFF1 | FFF1 | FFF1 |

FIG.18

| MIB NO. | LOGICAL SECTOR |
|---|---|
| 0 | × |
| 1 | MIA MAP (0) |
| 2 | × |
| 3 | FILE TABLE (0) |
| 4 | AE TABLE (0) |
| 5 | AE TABLE (1) |
| 6 | FILE TABLE (1) |
| 7 | MIA MAP (1) |
| 8 | × |
| 9 | FILE TABLE (2) |
| A | AE TABLE (2) |
| B | |
| C | |
| ⋮ | ⋮ |

FIG.17

INFORMATION RECORDING METHOD AND APPARATUS

This is a divisional of application Ser. No 09/247,715, filed Feb. 9, 1999, now U.S. Pat. No. 6,356,521.

BACKGROUND OF THE INVENTION

1. Field of the Invention

The present invention relates to an information recording method and apparatus for recording information into an information recording medium having sectors as recording unit formed thereon such as hard disc, optical disc, etc. under defective-sector management.

2. Description of Related Art

Conventionally, when a hard disc or optical disc having a defective sector, if any, is used in a disc drive, a defective sector management system inside the disc drive replaces the defective sector with a normal one, so that the recording medium will appear as if it had no such defective sector.

A conventional procedure of recording a date into a recording medium will be briefly described with reference to FIG. 1.

Generally, when a data is recorded into a recording medium 101 such as hard disc or optical disc, the data is directed to the recording medium via an OS (operation system). More particularly, the data is forwarded from an application through an OS core 105, file system 104, device driver 103 and a read/write device 102 in this order and then passed to the recording medium 101 as shown in FIG. 1.

In a procedure of reproducing a data from the recording medium 101, the data read from the medium 101 is directed through the read/write device 102, device driver 103, file system 104 and OS core 105 in this order and then passed to an application.

For recording or reproducing a data into or from the recording medium 101, the read/write device 102 will deal with a defective sector, if any, on the recording medium 101, so the stages above the device driver 103 can handle the data as if there were no defect sector on the recording medium 101.

A variety of methods of dealing with a defective sector adopted in the read/write head 102 has been proposed, typically including a slipping method and linear replacement method.

These conventional methods of dealing with a detective sector will be discussed below with reference to FIG. 2. It is assumed, for example, in FIG. 2(A) the a twelfth physical address is a defective sector and hundredth and subsequent physical addresses are provided as substitute sectors.

The slipping method is such that when a defective sector is found by the medium check during disc initialization, a sector physically next to the defective sector is used as substitute sector.

In this slipping method, the thirteenth and subsequent physical addresses next to the twelfth physical address are used as substitute sectors for the twelfth and subsequent logical addresses as shown in FIG. 2(B).

As mentioned above, since a sector located downstream of a defective sector found is used as a substitute sector in the slipping method, no time of seek for a substitute sector is required with little reduction of data transfer rate of the disc drive. However, since it is necessary to locate and register all detective sectors in a recording medium before actually using the medium, a recording medium going to be used has to be checked for defects or defective sectors beforehand.

On the other hand, the linear-replacement method is such that some locations in a recording medium are provided as substitute sectors in advance during disc initialization and when a defective sector is found, one of the locations is used as substitute sector for the defective sector.

In the linear-replacement method, the hundredth physical address as substitute sector, in place of the twelfth physical address being the defective sector, corresponds to a physical address for a twelfth logical address as shown in FIG. 2(C).

This linear-replacement method is employed for dealing with a defective sector found after the recording medium is put into use. Since substitute sectors are placed separately from the detective sector on the recording medium, an extra time is required for seeking the substitute sector, which will result in a reduced data transfer rate of the disc drive. Thus, when an audio or video signal is being recorded or reproduced with respect to the recording medium, sound or image may possibly appear not continuous.

Digital audio and video information for recording into a recording medium are in various kinds such as audio and video stream data, stream data attributes, record of reproduced order of stream data, information on mapping of divided stream data on a recording medium, information on usable area on a recording medium, etc.

As will be seen from the foregoing, the conventional detective sector dealing methods handle the defective sectors in a stereotyped manner irrespectively of the kind of a data recorded on a recording medium. Therefore, a detector sector in a stream data and a one in an information on a stream mapping are handled in a same manner.

Of the above defective sectors, the defective sector found in the stream mapping information can successfully be dealt with by the linear-placement method. When the defective sector in a stream data is handled by this linear-placement method, however, the data transfer rate is reduced so that audio or video signal cannot successfully be recorded or reproduced.

On the other hand, the slipping method can successfully deal with a defective sector already existent on a recording medium when the medium is used. However, a recording medium has to be checked for any defect on the front side thereof before it is used for recording, which will lead to an increased manufacturing cost. Further, the slipping method cannot accommodate a defective sector found in a recording medium after the medium is used.

From the standpoint of the cost of a recording medium, if the quality of an audio or video information to be recorded into the recording medium is not considered so important, a defective sector found in a mapping management information has to be replaced with a normal sector but a one found in a stream data should not be so replaced as the case may be.

SUMMARY OF THE INVENTION

Accordingly, the present invention has an object to overcome the above-mentioned drawbacks of the prior art by providing an information recording method and apparatus adapted to prevent a rate at which a digital audio or video signal for recording into a recording medium is transferred from being reduced depending upon the kind of the signal, and which will not lead to any increase of manufacturing costs for the recording medium.

The above object can be attained by providing an information recording method in which data is recorded into a recording medium taking as recording unit a sector corresponding to a predetermined amount of information signal, comprising, according to the present invention, the steps of:

classifying an information signal for recording into the recording medium into any one of two or more groups depending upon the kind of the information signal; and recording the information signal into the recording medium while dealing with a defective sector, if any, in a manner designated for the group to which the information signal has been classified to belong at the above classifying step.

The above object can also be attained by providing an information recording apparatus for recording data into a recording medium taking as recording unit a sector corresponding to a predetermined amount of information signal, comprising, according to the present invention:

means for classifying an information signal for recording into the recording medium into any one of two or more groups depending upon the kind of the information signal; and means for recording the information signal into the recording medium while dealing with a defective sector, if any, in the recording medium in a manner designated for the group to which the information signal has been classified to belong at the above classifying step.

These objects and other objects, features and advantages of the present intention will become more apparent from the following detailed description of the preferred embodiments of the present invention when taken in conjunction with the accompanying drawings.

BRIEF DESCRIPTION OF THE DRAWINGS

FIG. 2 shows a conventional method of dealing with a defective sector in a recording medium;

FIG. 16 shows the configuration of a file system descriptor;

FIG. 17 shows the configuration of a management information area (MIA); and

FIG. 18 shows the configuration of a MIA map.

DETAILED DESCRIPTION OF THE PREFERRED EMBODIMENTS

Figures 1, 2A, 2B, 2C:
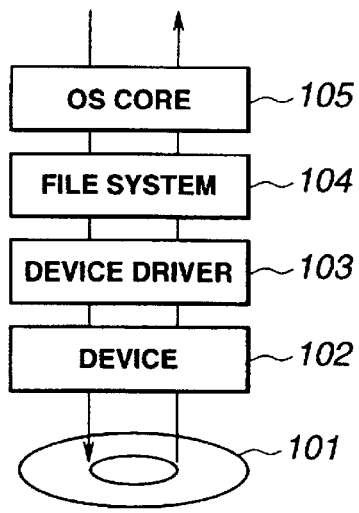
FIG. 1 illustrates a conventional procedure of recording a date into a recording medium.
Figure 3:
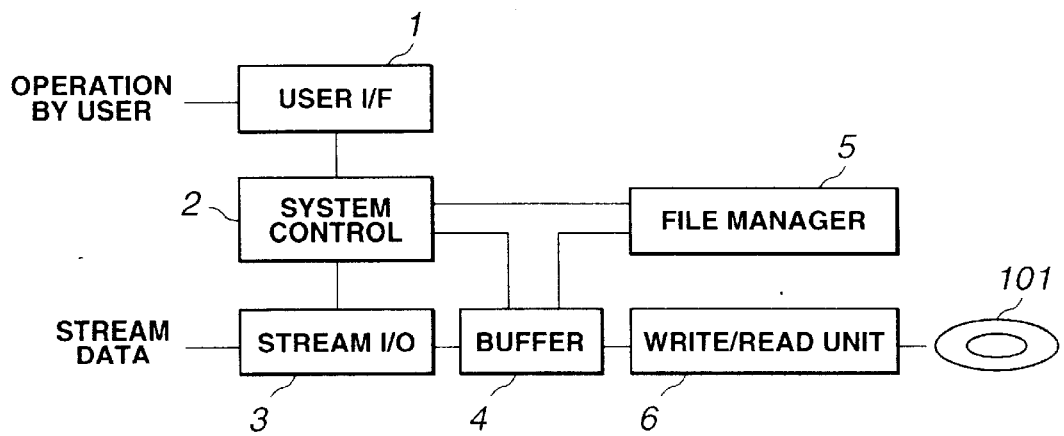
FIG. 3 is a schematic block diagram of an information recording apparatus according to the present invention.

Referring now to FIG. 3, there is shown, in the form of a schematic block diagram, an information recording apparatus according to the present invention. As shown, the information recording apparatus comprises mainly a user input/output 1 which is supplied with a data from a user of the apparatus and provides a data to the user, system controller 2 which will be further described later, a stream input/output 3 which is supplied with a stream data and provides it as output, buffer 5 which will also further be described later, file management unit 5 which will also further be described later, and a write/read unit 6 which writes and reads a data into or from a recording medium 101.

The user input/output 1 is a so-called user interface to accept an input from the user such as command, etc. and inform the user of the status of the recording medium 101. The user input/output 1 is adapted to send a data supplied from a keyboard, for example, to the system controller 2 and provide a data given from the system controller 2 to a liquid crystal display.

The stream input/output 3 receives a stream data supplied to the information recording apparatus and sends it to the buffer 4, under the control of the system controller 2. Also, the stream input/output 3 is supplied with a stream data from the buffer 4 and provides it as output, under the control of the system controller 2. The stream input/output 3 is adapted to accommodate a bit stream of an MPEG-coded picture, for example.

The write/read unit 6 writes and reads an information signal into or from the recording medium 101 under the control of the system controller 2. That is, the write/read unit 6 is adapted to write a data supplied from the buffer 4 into the recording medium 101 and sends a data read from the recording medium 101 to the buffer 4.

The recording medium 101 maybe a magneto-optical disc, for example. In this case, the write/read unit 6 will use its head to record a data onto a signal recording surface of the recording medium (magneto-optical disc) 101 and its pickup to reproduce a data from the signal recording surface.

The file management unit 5 manages files in the recording medium 101 via the write/read unit 6. The buffer 4 stores temporarily a data transferred between the stream input/output 3 and write/read unit 6. The system controller 2 controls the whole information recording apparatus.

Furthermore, under the control of the system controller 2, the file management unit 5 controls the write/read unit 6 and buffer 4, with consideration given to the file configuration in the recording medium 101, so that a data can be correctly recorded or reproduced into or from the recording medium.

Also, the file management unit 5 is adapted to detect, when a defective sector is found in the recording medium 101, the kind of a file in the detective sector so that the defective sector can be dealt with suitably for the data kind. The defective sector is handled as will further be discussed later.

The buffer 4 provisionally stores a data transferred between the stream input/output 3 and write/read unit 6 under the control of the system controller 2 and file management unit 5. The buffer 4 employs an FIFO (first-in, first-out) storage means for provisional storage of such a data.

As mentioned in the above, the system controller 2 controls the whole information recording apparatus. More particularly, the system controller 2 controls the user input/output 1, stream input/output 3, buffer 4 and file management unit 5 to control a data write and read into or from the recording medium 101.

Also the system controller 2 runs a sequence of operations for dealing with a defective sector found in the recording medium 101 as will be discussed later.

A defective sector found in the recording medium is be coped with in the information recording apparatus of the present invention as will be described herebelow. An information for recoding into the recording medium is classified by the information recording apparatus into three groups as will be discussed below.

In the information recording apparatus according to the present invention, information signals are classified into three groups: First group including information used by a file management system in the file management unit to manage files; second group including audio and video stream data files; and third group including files in which information descriptive of contents of a file, reproduced order of data, etc. are stored.

This classification of information signals into such groups is done by the file management system in the file management unit under the control of the system controller.

The above-mentioned three groups are different in importance or degree of importance from one to the other. That is, the first group of information related to the file management is given a highest importance, the third group of information related to a commentary of the contents of a stream data is given a second highest importance, and the second group of information including stream data files is given the lowest importance. Depending upon these differences in importance of an information signal, a defective sector found in the recording medium will be coped with in a manner designated for the second group to which the information signal has been classified to belong.

Since an information signal belonging to the first group including information used for file management by the file management system has the highest importance, it has to be recorded in a positive manner. To this end, the following will be effected to deal with the detective sector.

Namely, the information recording apparatus according to the present invention is adapted to read an information signal into the recording medium once, and read it from the medium for ascertaining that the information signal has correctly been written in the recording medium.

Also, the information recording apparatus of the present invention is adapted to use, if an error is detected from a sector at write of an information signal into the recording medium or at read of an information signal once written in the medium, another sector after that. In this case, the file management system will manage which sector is to be used for recording of an information signal. Then, an information on a sector to be used instead of the sector the file management system has decided to be defective is written as an information belonging to the first group into the recording medium.

The information recording apparatus of the present invention is also adapted to write a same data in two or more different locations on the recording medium. This measure has an object to cope with defective sectors which will be found after the information is written, such as caused by dust, scratch, growing defect or similar.

Owing to this fail-safe feature, even if a sector from which an information signal is read is found defective, a same information signal written in another location is read and written into a new location determined by the file management system. Thereafter, the new sector is to be used. Also in this case, an information on the new sector position is written as an information belonging to the first group.

An information classified into the second group including audio and video stream data files has to be written within a predetermined length of time. Therefore, it is not possible to read such an information from the recording medium to ascertain whether it has correctly been written there.

To cover the above demerit of the second group of information, the following statuses are adopted taking as unit an allocation extent (AE) forming a part of a file:

01 Used as a part of a file
11 Used as a part of a file, but containing a defective sector
00 Unused but unusable
10 Unused and unusable because it contains a detective sector Thus in the information recording apparatus according to the present invention, when a defective sector is found at write of an information into the recording medium, the defective sector is taken as one allocation extent and the status of the allocation extent is set to "10".

After that, when a data is recorded into the recording medium, a sector is avoided of which the allocation extent status is "10" indicating that the sector is a defective one.

When the allocation extent status "10" is allocated to a defective sector, a data for recording into the recording medium is contiguously disposed by skipping the defective sector. As a result, the recording area is reduced because of the existence of the defective sector so that the data will cone to an area currently used as the case may be. In this case, however, the data may be passed to a next allocation extent.

This accommodation of defective sector is only possible when the file management system can interpret the contents of a data located in the defective sector. This method of dealing with defective sectors can provide a same performance as the previously mentioned slipping method without the necessity of previously checking the recording medium for defects.

In the information recording apparatus of the present invention, when a defective sector is found at write of an information into the recording medium, the status of an allocation extent including the detector sector may simply be set to "11". In this case, it is meant that the sector in question is being used as a part of a file but it is defective.

This setting to "11" of the status of allocation extent of a defective sector is effective for an application in which not so strong an emphasis is put on the quality of an audio or video data recorded in the recording medium.

In this case, a next information can be written by avoiding the defective sector in the recording medium. Thus, the detective sector will not be used any longer. Namely, the recording medium will be checked for any defect by a data itself recorded therein.

In the information recording apparatus of the present invention, when a defective sector is found at write of an information into the recording medium, the status of allocation extent including the found defective sector is set "11". Thus, the status "11" of allocation extent means that the sector is being used as a part of a file but is defective.

In the information recording apparatus, when a file is deleted from the recording medium, an allocation extent having a status "01" will change to a status "00" and open the file. That is to say, a status indicating that an allocation extent is being used as a part of a file will change to a status indicating that an allocation extent is unused and usable.

An allocation extent having a status "11" take a defective sector as one allocation extent and set the status of the allocation extent to "10". Namely, a status indicating an allocation extent is being as a part of a file and including a defective sector will change to a status of an allocation extent in which a sector is unusable because it is defective, and open other areas.

When an information, belonging to the third group including files in which information descriptive of contents of a stream data, reproduced order of data, etc. are stored, is written into the recording medium, a defective sector will be accommodated as in the following.

Different from an information belonging to the second group, any information in this third group has not to be written within a predetermined length of time but it suffices to complete the information write by the time when the recording medium is extracted from the apparatus or the apparatus is stopped from operating. Thus, a defective sector with this third group can be dealt with in a same manner as a one with the first group of information.

More particularly, after an information is written into the recording medium set in the information recording apparatus of the present invention, it is read out from the recording medium for ascertaining that the information has correctly been written in the medium. If an error is detected at write of the information into the medium or at read of the information once written in the medium, the sector found defective will not be used any longer.

Since any information involved in the third group is less important than a one belonging to the first group, however, it will not be written in a plurality of locations in the recording medium.

Figure 4:
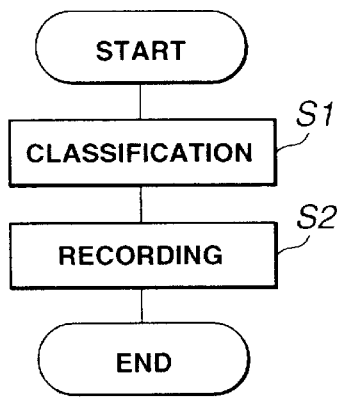
FIG. 4 is a flow chart of a series of operations in a recording procedure.

Next, how an information is recorded into the recording medium by the information recording apparatus of the present invention will be discussed herebelow with reference to FIG. 4. FIG. 4 is a basic flow chart of a series of operations in a recording procedure according to the present invention. An information signal is recorded in the recording medium having formed therein sectors each for a predetermined amount of information signal. Basically, an information signal is classified into any of two or more groups depending upon its contents at step S1, and the information signal is recorded into the recording medium while dealing with a defective sector, if any, in the recording medium in a manner designated for the group to which the information signal has been classified at step S1 to belong.

At step S1, an information signal for recording into the recording medium is subjected to classification into at least three groups: First group including information used for file management, a second group including audio and video stream data files, and a third group including files in which information descriptive of contents of a stream data, reproduced order of data, etc. are stored.

The classification into these three groups is based on the importance of an information signal for recording into the recording medium. That is, the first group of information is given a highest importance, the third group is given a second highest importance, and the second group is given the lowest importance as having previously been described.

The second group includes stream data. To keep a stream data contiguous, it is necessary to maintain the data transfer rate higher than a predetermined value.

At step S2, the information signal is recorded into the recording medium in a manner designated for the group to which the information signal is classified to belong. Namely, the recording manner is different from one group to another. This will further be described herebelow. A series of operations shown in each of the flow charts is a routine effected each time invoked. Upon completion of each series of operations, the routine is ended.

Figure 5:
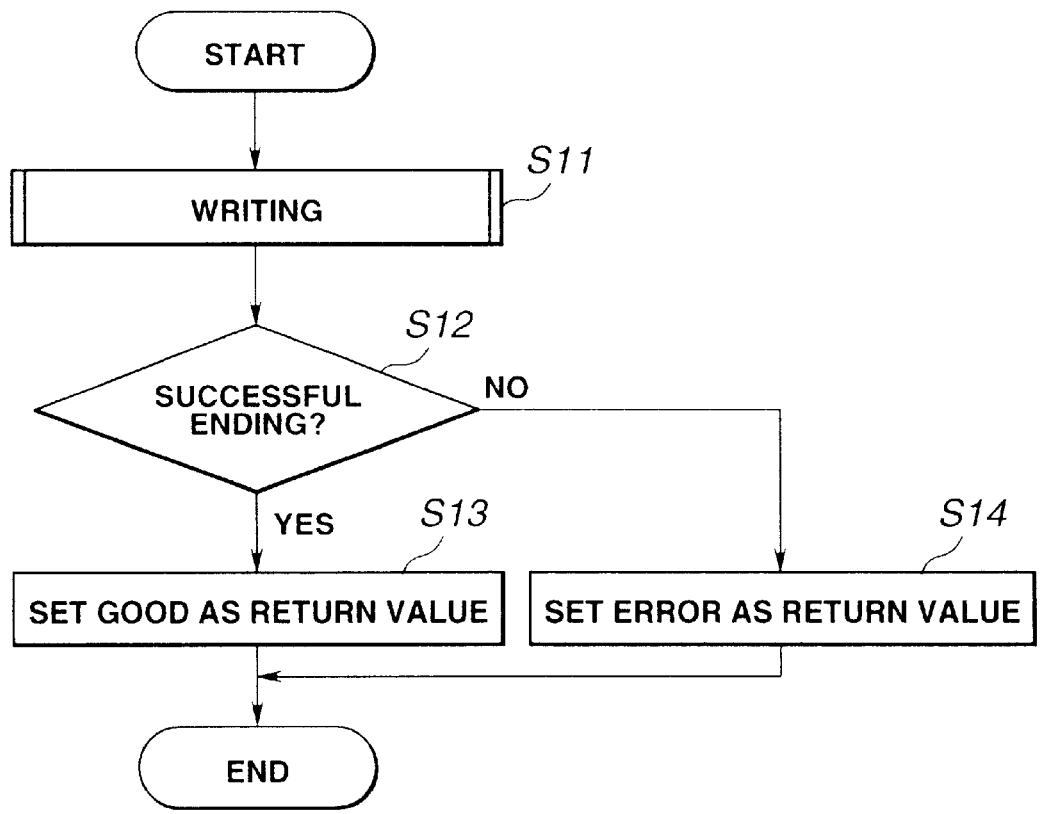
FIG. 5 is a flow chart of a basic write routine.

Referring now to FIG. 5, there is illustrated a flow chart of a basic write routine. According to this basic write routine, an information signal is simply written into the recording medium without any verification.

As shown in FIG. 5, at initial step S11, the information signal is written into the recording medium. At step S12, it is judged whether the information signal has successfully been written. When it has successfully been written into the recording medium, affirmative decision "YES" is made and the operation proceeds to step S13. If not, negative decision "NO" is made and the operation goes to step S14.

At step S13, the routine is ended with "GOOD" set as return value. At step S14, "ERROR" is set as return value and the routine is ended.

Figure 6:
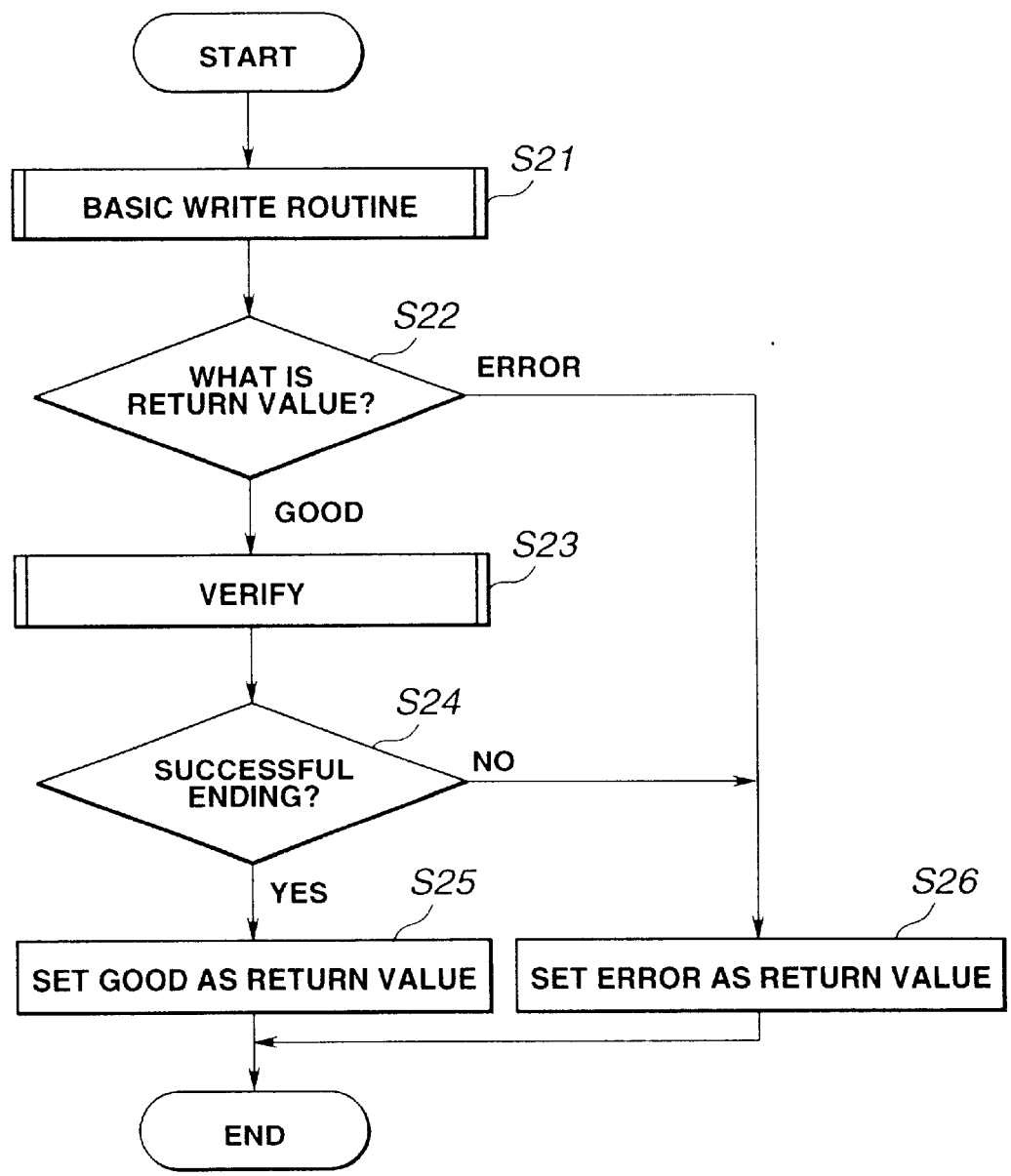
FIG. 6 is a flow chart of a basic write and verify routine.

Referring now to FIG. 6, there is illustrated a flow chart of a basic write and verify routine. According to this basic routine, the information signal written into the recording medium under the basic write routine is verified to check the information signal written in the recording medium.

At step S21, the basic write routine shown in FIG. 5 is executed. Next step S22 is branched depending upon which the return value from the basic write routine is. Namely, when the return value is "GOOD", the operation proceeds to step S23. If the return value is "ERROR77", the operation goes to step S26.

At step S23, the information signal written in the recording medium is verified to ascertain whether it has successfully been written there. Next step S24 is branched depending upon whether the information signal has successfully been written. When the information signal has successfully been written, the judgment is "YES' with proceeding to step S25. If the information signal write fails, the judgement is "NO" with the operation going to step S26.

At step S25, "GOOD" is set as return value and the routine is ended. At step S26, the routine is ended with "ERROR" set as return value.

Figure 7:
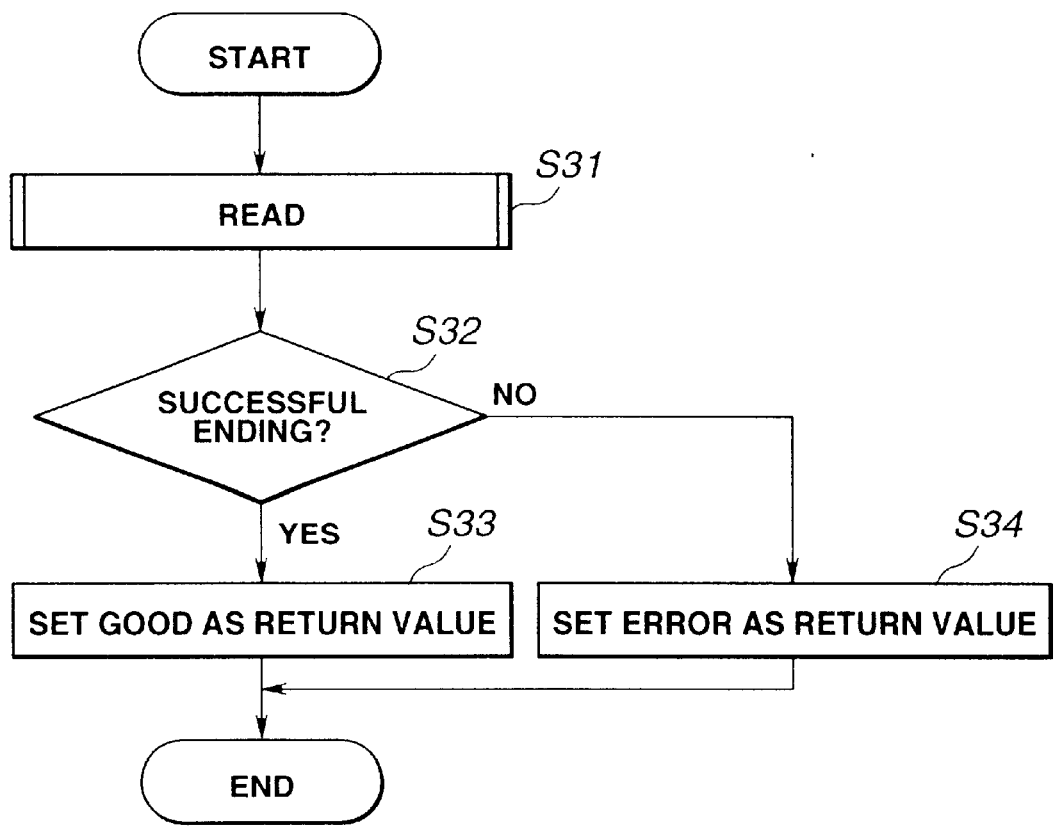
FIG. 7 is a flow chart of a basic read routine.

Next, a basic read routine will be discussed with reference to FIG. 7. This routine is intended to simply read an information signal written in the recording medium.

At first step S31, the read routine is executed. Next step S32 is branched depending upon whether the information signal has successfully been written. That is to say, when the write has successfully completed, the operation proceeds to step S33. If not, the operation goes to step S34.

At step S33, the routine is ended with "GOOD" set as return value. At step S34, "ERROR" is set as return value and the routine is ended.

Figure 8:
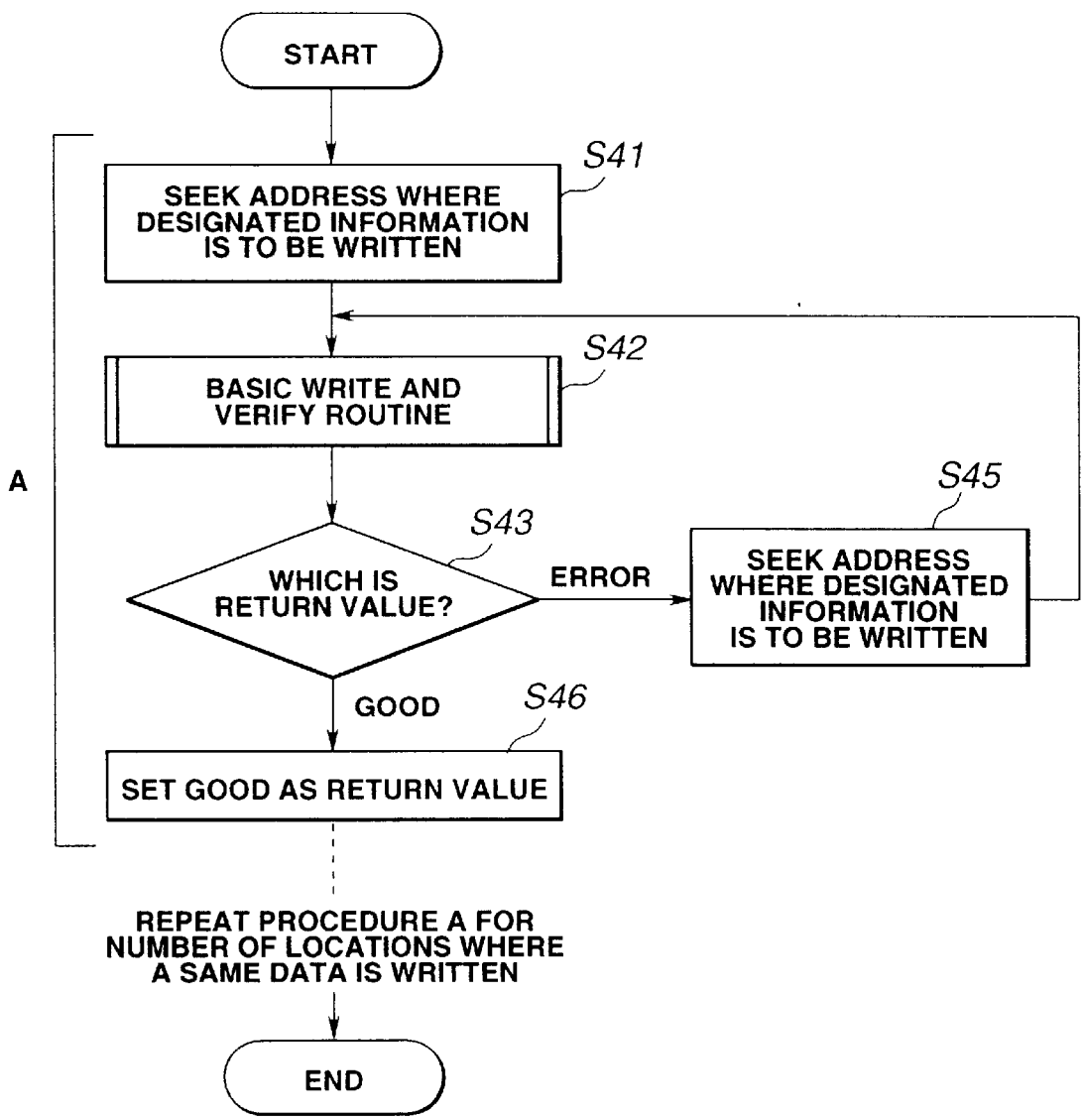
FIG. 8 is a flow chart of a file management information write routine.

Next, a file management information write routine will be discussed with reference to FIG. 8. Since an information signal concerning the file management belongs to the first group in which emphasis is given to the importance of information signals, a file management information signal is written at a plurality of locations in the recording medium under this file management information write routine in order to assure a positive write of the information signal in the recording medium.

At step S41, addresses where a designated information is to be written are sought. At step S42, the basic write and verify routine shown in FIG. 6 is executed.

Next step S43 is branched depending upon which the return value is, "GOOD" or "ERROR". If the return value is "GOOD", the operation proceeds to step S46. When it is "ERROR", the operation goes to step S45.

At step S46, "GOOD" is set as return value. Steps S41, S42, S43 and S46 following the step S46 and defined with a letter "A" are repeated for a number of the locations where the same designated information signal is written. Thereafter, the routine is ended.

On the other hand, addresses where the designated information is to be written are sought at step S45, with the operation going back to step S42.

Figure 9:
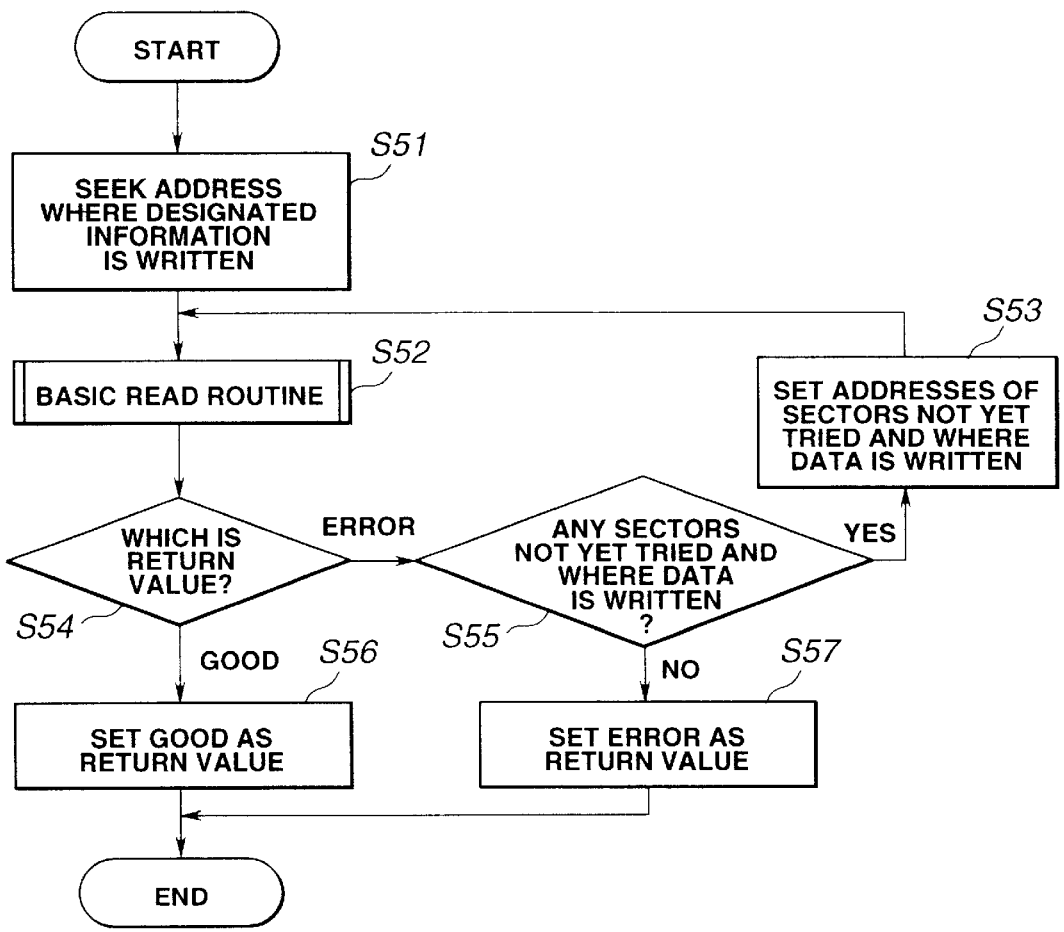
FIG. 9 is a flow chart of a file management information read routine.

Next, a file management information read routine will be described with reference to FIG. 9. This file management information read routine reads a file management information, if it cannot be read under the basic read routine, from another file management information written at one of the other addresses where the same information is written under the file management information write routine shown in FIG. 8.

At step S51, an address where the designated information is written is sought. At next step S52, the basic write routine shown in FIG. 7 is executed. Step S54 is branched depending upon which the return value is.

That is, when the return value is "GOOD", the operation proceeds to step S56. If it is "ERROR", the operation goes to step S55.

At step S56, "GOOD" is set as return value and the routine is ended.

Step S55 is branched depending upon whether there remains any one not yet tried of the sectors where the same information has been written. If there is such an address, affirmative decision "YES" is made and the operation goes to step S53. If not, negative decision "NO" is made and the operation goes to step S57.

At step S53, the address of a one not yet tried of the sectors where the same information has been written is set and the operation goes to step S52.

At step S57, "ERROR" is set as return value and the routine is ended.

Figure 10:
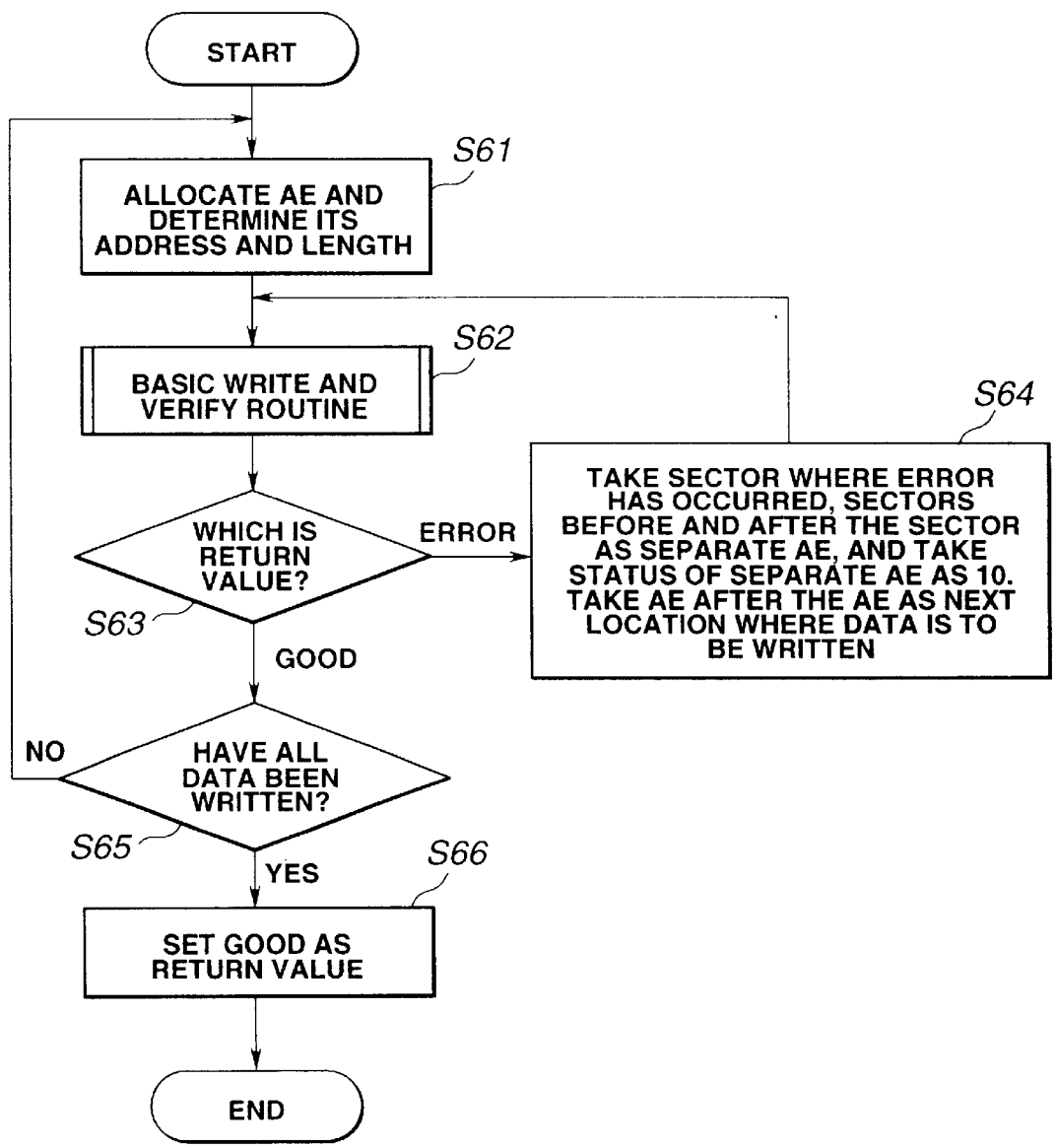
FIG. 10 is a flow chart of a file write routine for other than stream data.

Next, a file write routine for other than stream data will be described with reference to FIG. 10. This routine is intended to continuously dispose the information signal by skipping a defective sector.

At first step S61, an allocation extent (AE) is allocated to determine the address and length of the allocation extent. At next step S62, the basic write and verify routine shown in FIG. 6 is executed. Note that the allocation extent is indicated with a reference "AE".

Next step S63 is branched depending upon which the return value is. That is to say, when the return value is "GOOD", the operation goes to step S65. If it is "ERROR", the operation proceeds to step S64.

At step S64, a sector where an error is found and sectors before and after the defective sector are taken as separate allocation extent and the status of the allocation extent where the error is found is taken as "10". An allocation extent after the separate allocation extent is taken as a next location where an information signal is to be written next, and the operation goes to step S62.

As having previously been described, the status of allocation extent has the following meaning:

01 The allocation extent is used as a part of a file.
11 The allocation extent is used as a part of a file, but contains a defective sector.
00 The allocation extent is unused but unusable.
10 The allocation extent is unused and unusable because it contains a detective sector.

Step S65 is branched depending upon whether all information signals have been written. That is, when all the information signals have been written, affirmative decision "YES" is made and the operation goes to step S66. If not, negative decision "NO" is made and the operation goes to step S61.

At step S66, "GOOD" is set as return value and the routine is ended.

Figure 11:
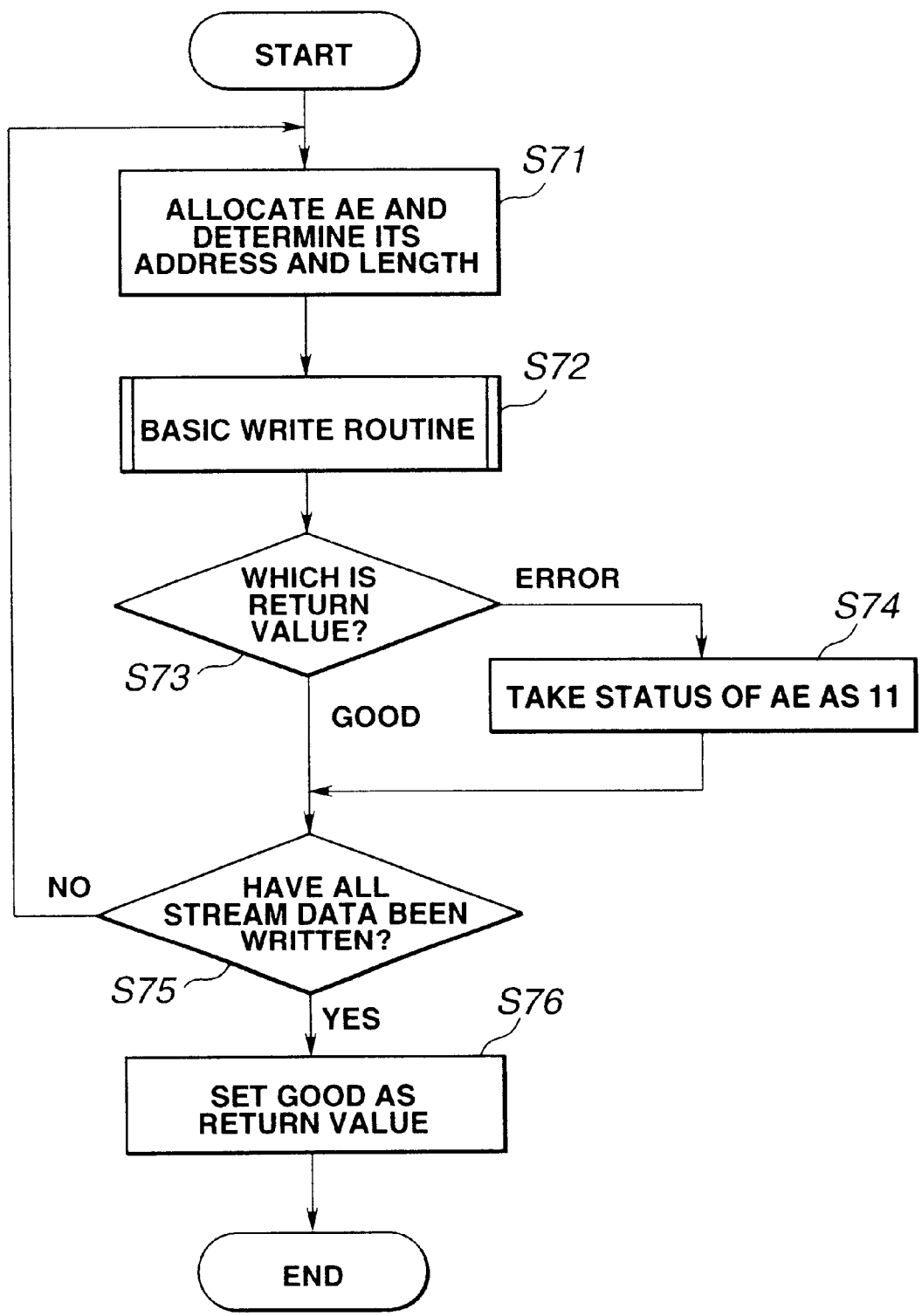
FIG. 11 is a flow chart of a first example of file write routine for stream data.

Next, a first example of file write routine for stream data will be described with reference to FIG. 11.

In this first example of stream data file write routine, a defective sector is taken as status "11". This is effective for an application in which the quality of audio and video data is not so much emphasized. In this case, the defective sector can be avoided at a next write of such a data. Namely, the defective sector will not be used any longer. The recording medium will be checked for any defect by a data itself recorded therein.

At first step S71, an allocation extent is allocated to determine the address and length of the allocation extent. At next step S72, the basic write routine shown in FIG. 5 is executed. Next step S73 is branched depending upon which the return value is. That is to say, when the return value is "GOOD", the operation goes to step S75. If it is "ERROR", the operation proceeds to step S74.

Step S75 is branched depending upon whether all information signals have been written. That is, when all the information signals have been written, affirmative decision "YES" is made and the operation goes to step S76. If not, negative decision "NO" is made and the operation goes back to step S71.

At step S76, "GOOD" is set as return value and the routine is ended.

Figure 12:
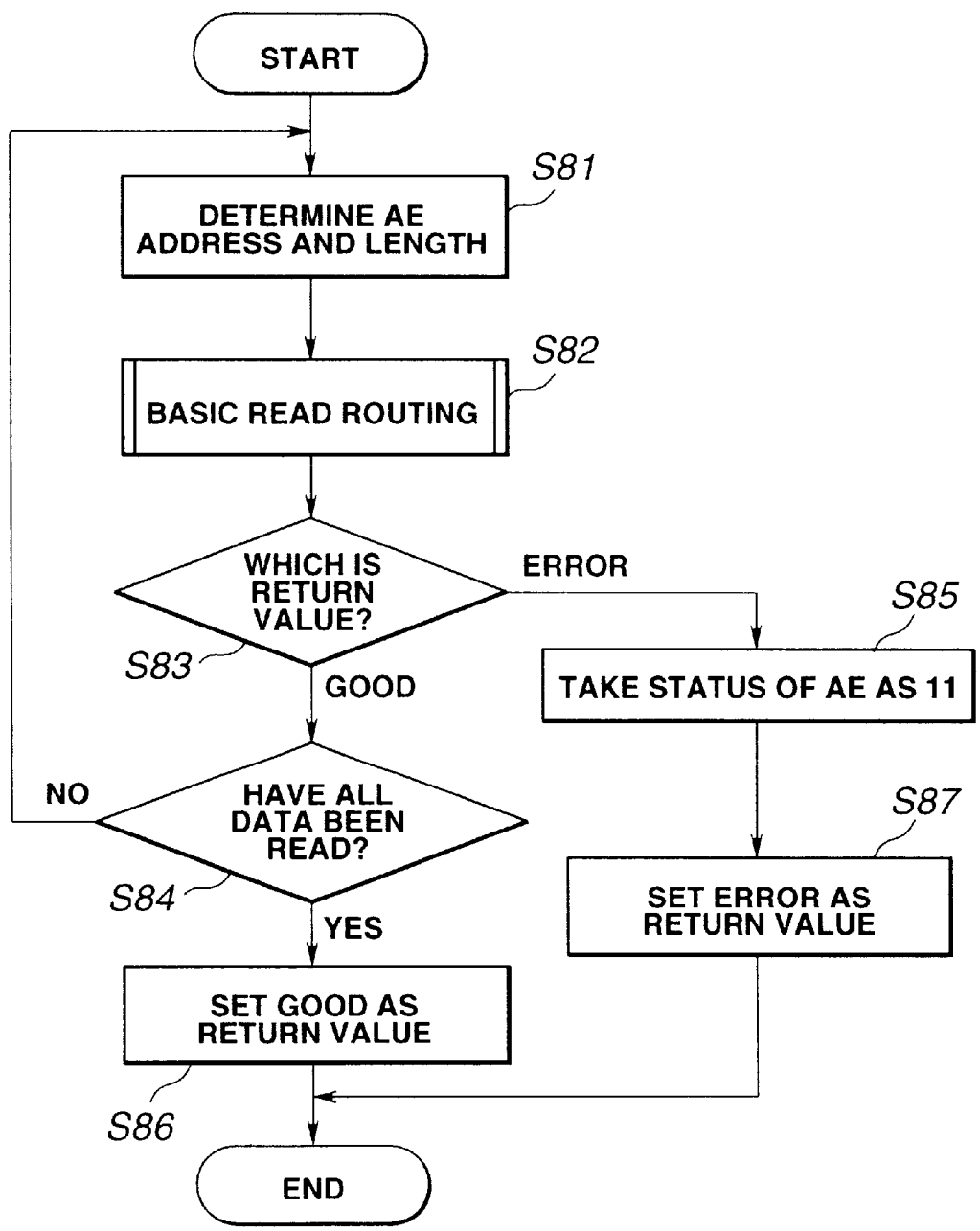
FIG. 12 is a flow chart of a file read routine for other than stream data.

Next, a flow chart of a file read routine for other than stream data will be described with reference to FIG. 12.

At first step S81, an allocation extent is allocated to determine the address and length of the allocation extent. At next step 82, the basic read routine shown in FIG. 7 is executed. Next step S83 is branched depending upon which the return value is. That is to say, when the return value is "GOOD", the operation goes to step S85. If it is "ERROR", the operation proceeds to step S84.

Step S84 is branched depending upon whether all information signals have been written. That is, when all the information signals have been written, affirmative decision "YES" is made and the operation goes to step S86. If not, negative decision "NO" is made and the operation goes back to step S81.

At step S86, "GOOD" is set as return value and the routine is ended.

At step S85, the status of the allocation extent is set "11". At next step S87, "ERROR" is set as return value and the routine is ended.

Figure 13:
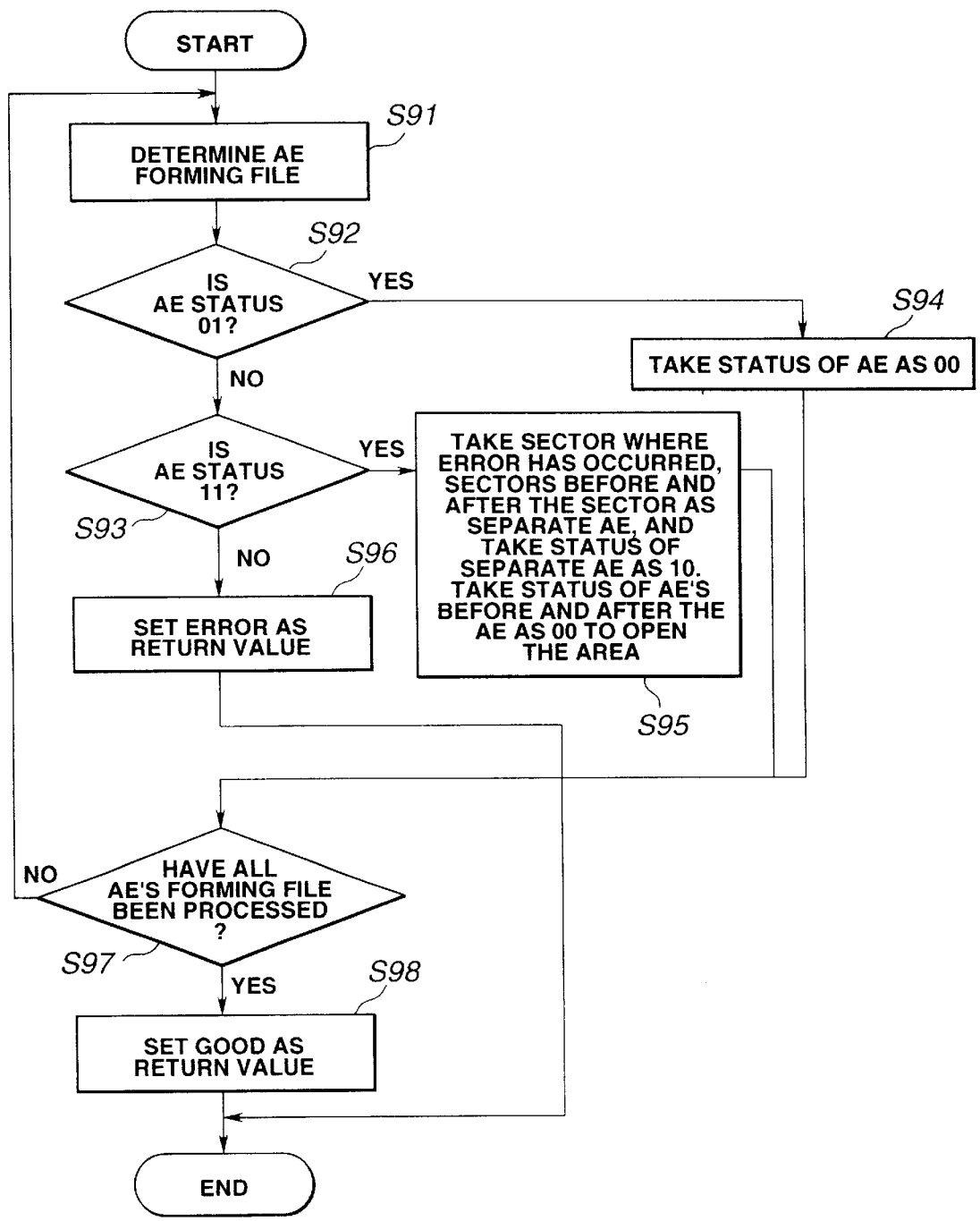
FIG. 13 is a flow chart of a file read routine for stream data.

Next, a file read routine for stream data will be described with reference to FIG. 13.

At first step S91, an allocation extent forming a part of a file is sought. Next step S92 is branched depending upon whether the status of the allocation extent is "01". That is to say, when the status is "01", affirmative decision "YES" is made and the operation goes to step S94. If not, negative decision "NO" is made, and the operation goes to step S93.

Step S93 is branched depending upon whether the status is "11". Namely, when it is "11", affirmative decision "YES" is made and the operation goes to step S95. If not, negative decision "NO" is made and the operation goes to step S96.

At step S94, the status of allocation extent is set "00" to open the area and the operation goes to step S97.

At step S95, a defective sector and sectors before and after the defective sector are taken as separate allocation extent and the status of the allocation extent where the defect is found as "10". The status of allocation extent before and after the allocation extent having the defective sector is set "00" to open the area, and the operation goes to step S97.

At step S96, "ERROR" is set as return value and the routine is ended.

Next S97 is branched depending upon whether allocation extent forming all the files have been processed as in the above. Namely, if they have been processed, the judgement is "YES" and the operation goes to step S98. If not, negative decision "NO" is made and the operation goes back to step S91.

At step S98, "GOOD" is set as return value and the routine is ended.

Figure 14:
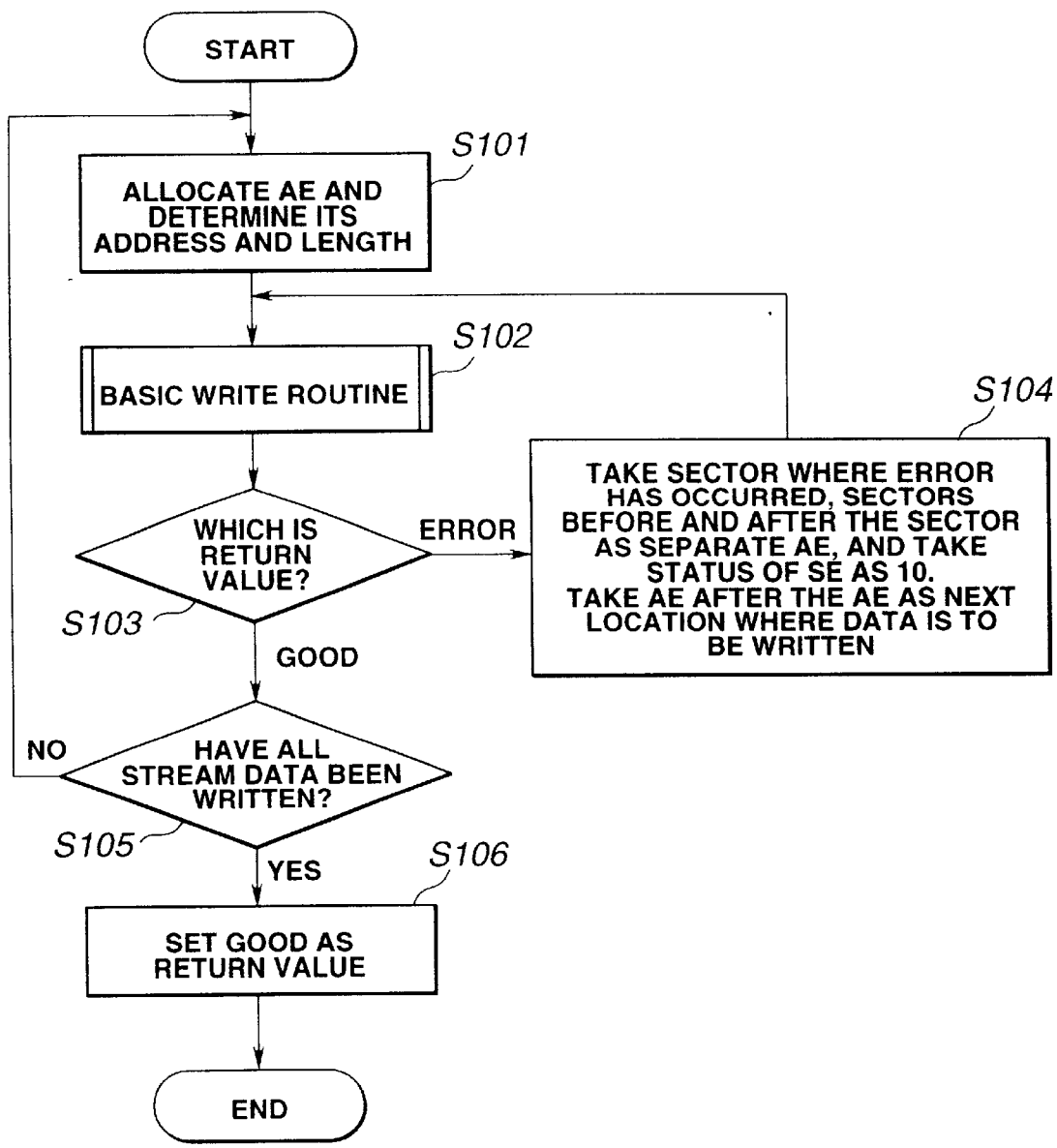
FIG. 14 is a flow chart of a second example of file write routine for stream data.

A second example of file write routine for stream data will be described with reference to FIG. 14. This example finds a defective sector and disposes a data contiguously by skipping the defective sector when the defective sector has a status "10".

In this example, the storage area is decreased because of the existence of a defective sector and it will eventually overlap an area already used as the case may be. In this case, however, the data may be passed to a next allocation extent. This accommodation of defective sector is only possible when the file management system can interpret the contents of a data located in the defective sector. This method of dealing with defective sectors can provide a same performance as the previously mentioned slipping method without the necessity of previously checking the recording medium for defects.

At first step S101, an allocation extent is allocated to determine the address and length of the allocation extent. At next step S102, the basic write routine shown in FIG. 5 is executed. Next step S103 is branched depending upon which the return value is. That is to say, when the return value is "GOOD", the operation goes to step S105. If it is "ERROR", the operation proceeds to step S104.

At step S104, a sector where an error is found and sectors before and after the defective sector are taken as separate allocation extent and the status of the allocation extent where the error is found is taken as "10". An allocation extent after the separate allocation extent is taken as a next location where an information signal is to be written next.

Step S105 is branched depending upon whether all information signals have been written. That is, when all the information signals have been written, affirmative decision "YES" is made and the operation goes to step S106. If not, negative decision "NO" is made and the operation goes back to step S101.

At step S106, "GOOD" is set as return value and the routine is ended.

Figure 15:
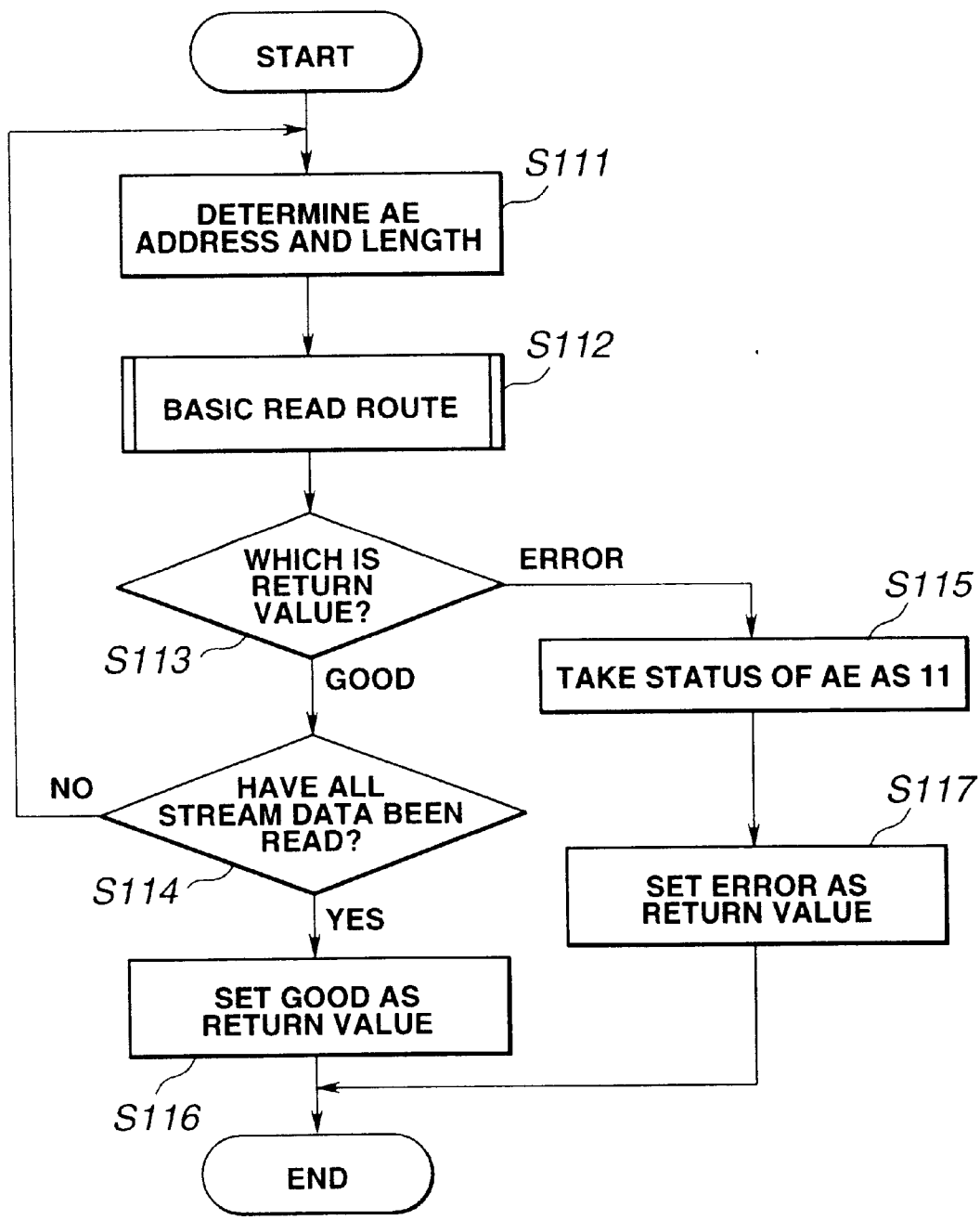
FIG. 15 is a flow chart of a file read routine for stream data.

Next, a file read routine for stream data will be described with reference to FIG. 15.

At first step S111, the address and length of an allocation extent are determined. At next step S112, the basic write routine shown in FIG. 7 is executed. Next step S113 is branched depending upon which the return value is. That is, when the return value is "GOOD", the operation goes to step S114. If it is "ERROR", the operation goes to S115.

Step S114 is branched depending upon whether all stream data have been written. When the data have been written, affirmative decision "YES" is made and the operation goes to step S116. If not, negative decision "NO" is made and the operation goes back to step S111.

On the other hand, at step S115, the status of the allocation extent is set "11". At next step S117, "ERROR" is set as return value and the routine is ended.

At step S116, "GOOD" is set as return value and the routine is ended.

Coping with defective sector when writing an information belonging to the above-mentioned first group will be discussed herebelow.

FIG. 16 shows the configuration of a file system descriptor stating a file management information. As shown, the file system descriptor consists mainly of a main MIA (management information area) and an auxiliary MIA, each including a start logical sector No. of MIA.

The file system descriptor further comprises a MIB No. of MIA map in each of the main and auxiliary MIAs. The MIB No. can be used to extract a MIA map out of MIA.

The MIB is a sector inside MIA. The leading MIB in MIA is taken as 0 and subsequent MIBs are sequentially numbered. These Nos. are called the MIB Nos.

Such a file system descriptor belongs to the first group of information of which the importance is emphasized. Therefore, a file system descriptor is written in a plurality of locations in the recording medium to assure positive storage in the medium.

Next, the configuration of MIA will be discussed with reference to FIG. 17.

FIG. 17 shows the MIB Nos. and their logical sectors. More particularly, the MIB No. 0 corresponds to a defective sector, MIB. No. 1 to a MIA map (0), MIB. No. 2 to a second defective sector, MIB. No. 3 to a file table (0), MIB No. 4 to an AE table (0), MIB No. 5 to an AE table (1), MIB No. 6 to a file table (1), MIB No. 7 to a MIA map, MIB No. 8 to a defective sector, MIB No. 9 to a file table (2), and MIB No. A corresponds to an AE table (2).

Next, the configuration of a MIA map will be described with reference to FIG. 18. The MIA maps keep information on arrangement of tables in MIA.

An MIA map shown in FIG. 18 consists of a MIA map (0) of MIB No. 1 in an MIA shown in FIG. 17 and a MIA map (1) of MIB No. 7. Four rows and four columns forming a table in FIG. 18 correspond to the logical sectors in a MIA. More particularly, an element specified by the first row and first column of the table corresponds to MIB No. 0, a one by the first row and second column to MIB No. 1, a one by the first row and third column to MIB No. 2, a one by the first row and fourth column to MIB No. 3, a one by the second row and first column to MIB No. 4, a one by the second row and second column to MIB No. 5, a one by the second row and third column to MIB No. 6, a one by the second row and fourth column to MIB No. 7, a one by the third row and first column to MIB No. 8, a one by the third row and second column to MIB No. 9, a one by the third row and third column to MIB No. A, a one by the third row and fourth column to MIB No. B, and a one by the fourth row and first column corresponds to MIB No. C. This is also true for the subsequent relations.

In FIG. 18, "MIA map: 1" means that the first one of MIBs forming a MIA map has a No. 1. Similarly, "File table: 3" means that a MIB No. 3 forms a file table. "AE table: 4" means that a MIB No. 4 forms an AE table.

That is to say, a number "7" is indicated in the first row and second column of the table corresponding to MIB No. 1 of the first one of MIBs forming a MIA map. This number "7" means that the second MIB forming the MIA map has a No. 7. In the table, "FFFF" is indicated in the second row and fourth column for the MIB No. 7. This "FFFF" means that the MIB is the last one of MIBs forming the MIA map.

Also, a number "6" is indicated in the first row and fourth column of the table corresponding to MIB No. 3 of the third one of MIBs forming a file table. This number "6" means that the second MIB forming the file table has a No. 6. A number "9" is indicated in the second row and third column of the table corresponding to MIB No. 6. This number "9" means that the third MIB forming the file table has a No. 9. "FFFF" is indicated in the third row and second column of the table corresponding to MIB No. 9. This "FFFF" means that the MIB is the last one of MIBs forming the file table.

Furthermore, a number "5" is indicated in the second row and first column of the table corresponding to MIB No. 4 of the first one of MIBs forming an AE table. This number "5" means that the second MIB forming the AE table has a No. 5. "A" is indicated in the second row and second column of the table corresponding to MIB No. 5. This "A" means that the third MIB forming the AE table has a No. A. "FFFF" is also indicated in the third row and third column of the table corresponding to MIB No. A. This "FFFF" means that the MIB is the last one of the MIBs forming the AE table.

"FFF0" is indicated in each of the first row and first column, first row and third column, and third row and first column of the table corresponding to MIB Nos. 0, 2 and 8, respectively, of MIA. This "FFF0" corresponds to a defective sector.

Also, "FFF1" is indicated in the third row and fourth column, and subsequent rows and columns of the table corresponding to unused MIB Nos. below MIB No. B of MIA. This "FFF1" means that the sector is unused.

As having been described in the foregoing, the present invention provides an information recording method which selects a most suitable method of coping with a defective sector in a recording medium for an information for recording into the medium, thereby permitting to use the recording medium with a highest reliance and lowest cost.

Also, the present invention provides an information recording apparatus which selects a most suitable method of coping with a defective sector in a recording medium for an information for recording into the medium, thereby permitting to use the recording medium with a highest reliance and lowest cost.

What is claimed is:

1. A recording apparatus for recording on a disc shaped recording medium, comprising:

a recording unit operable to record disc management information, audio and/or video information and playback control information on the recording medium; and a controller operable to control the recording unit to perform a write and verify operation when the playback control information is recorded, and to control the recording unit not to perform the write and verify operation when the audio and/or video information is recorded, whereby when audio and/or video information is being recorded and a defective sector of the recording medium is encountered, an indication that the sector is defective is provided and the sector is passed over during recording, and when disc management information is being recorded and a defective sector of the recording medium is encountered a logical replacement is provided for the defective sector such that a defective indication is not necessary and the system does not appear to be passing over the sector.

2. A recording apparatus according to claim 1, wherein the controller controls the recording unit to replace the defective area with a replacement area when the playback control information is recorded.

3. A recording apparatus according to claim 1, wherein the controller controls the recording unit to perform the write and verify operation when the disc management information is recorded.

4. A recording apparatus according to claim 3, wherein the recording unit records a copy of the disc management information on the recording medium.

5. A recording apparatus for recording on a disc shaped recording medium, comprising the step of:

a recording disc management information, audio and/or video information and playback control information on the recording medium;

performing a write and verify operation when the playback control information is recorded, and not to performing the write and verify operation when the audio and/or video information is recorded, whereby when audio and/or video information is being recorded and a defective sector of the recording medium is encountered, an indication that the sector is defective is provided and the sector is passed over during recording, and when disc management information is being recorded and a defective sector of the recording medium is encountered a logical replacement is provided for the defective sector such that a defective indication is not necessary and the system does not appear to be passing over the sector.

6. A recording method according to claim 5, wherein the step of performing includes replacing the defective area with a replacement area when the playback control information is recorded.

7. A recording method according to claim 5, wherein the step of performing includes performing the write and verify operation when the disc management information is recorded.

8. A recording method according to claim 7, wherein the step of recording includes recording a copy of the disc management information on the recording medium.

* * * * *